(12) United States Patent
Priel et al.

(10) Patent No.: US 9,214,924 B2
(45) Date of Patent: Dec. 15, 2015

(54) INTEGRATED CIRCUIT AND METHOD FOR REDUCING AN IMPACT OF ELECTRICAL STRESS IN AN INTEGRATED CIRCUIT

(75) Inventors: Michael Priel, Netanya (IL); Dan Kuzmin, Givat Shmuel (IL); Yossi Shoshany, Gan Yavne (IL)

(73) Assignee: Freescale Semiconductor, Inc., Austin, TX (US)

( * ) Notice: Subject to any disclaimer, the term of this patent is extended or adjusted under 35 U.S.C. 154(b) by 125 days.

(21) Appl. No.: 14/006,388

(22) PCT Filed: Mar. 25, 2011

(86) PCT No.: PCT/IB2011/051283
§ 371 (c)(1),
(2), (4) Date: Sep. 20, 2013

(87) PCT Pub. No.: WO2012/131425
PCT Pub. Date: Oct. 4, 2012

(65) Prior Publication Data
US 2014/0002160 A1    Jan. 2, 2014

(51) Int. Cl.
*H03K 3/011* (2006.01)
*H03K 19/003* (2006.01)

(52) U.S. Cl.
CPC .......... *H03K 3/011* (2013.01); *H03K 19/00346* (2013.01)

(58) Field of Classification Search
CPC .......... G06F 1/3203; G06F 1/06; G06F 1/12; H03K 3/011; H03K 3/02; H03K 7/08; G09G 3/2048; G09G 3/3208; G09G 5/18; H04L 7/0008; H04L 7/00; H04L 27/2647

USPC .......................................... 327/147, 161, 198
See application file for complete search history.

(56) References Cited

U.S. PATENT DOCUMENTS 5,818,764 A    10/1998    Yiu et al.
6,297,974 B1    10/2001    Ganesan et al.
7,000,162 B2    2/2006    Bernstein et al.
(Continued)

FOREIGN PATENT DOCUMENTS

WO    2007024435 A2    3/2007

OTHER PUBLICATIONS

Flautner K, et al: "Drowsy Caches: Simple Techniques for Reducing Leakage Power", Computer Architecture, 2002. Proceedings. 29th Annual International Symposium on, May 25-29, 2002, pp. 148-157.
(Continued)

*Primary Examiner* — John Poos

(57) ABSTRACT

An integrated circuit is provided that includes a plurality of modules comprising at least one clock-gated module and a controller unit, which is arranged to enable and disable provision of a clock signal to the at least one clock-gated module. The at least one clock-gated module includes one or more electronic circuits arranged to be in a first state of an electrical stress condition during a first portion of a period of time and in a second state of less electrical stress than in the first state during a second portion of the period of time. The at least one clock-gated module is further arranged to switch the one or more electronic circuits between the first state and the second state such that a change of a characteristic of at least one of the one or more electronic circuits caused by the electrical stress condition is at least partially reduced.

20 Claims, 2 Drawing Sheets

(56) References Cited

U.S. PATENT DOCUMENTS

| | | |
|---|---|---|
| 7,009,905 B2 | 3/2006 | Aipperspach et al. |
| 7,181,188 B2 | 2/2007 | Vu et al. |
| 7,626,425 B2 | 12/2009 | Athas et al. |
| 7,793,181 B2 | 9/2010 | Chandra et al. |
| 2009/0019303 A1* | 1/2009 | Rowland ....................... 713/501 |

OTHER PUBLICATIONS

International Search Report and Written Opinion correlating to PCT/IB2011/051283 dated Nov. 30, 2011.

* cited by examiner

INTEGRATED CIRCUIT AND METHOD FOR REDUCING AN IMPACT OF ELECTRICAL STRESS IN AN INTEGRATED CIRCUIT

FIELD OF THE INVENTION

This invention relates to an integrated circuit and a method for reducing an impact of electrical stress in an integrated circuit.

BACKGROUND OF THE INVENTION

Electronic systems are built using one or more semiconductor integrated circuits and can be found in many devices, for example personal computers, digital cameras, mobile phones, personal digital assistants, modern household appliances or cars, just to name a few. There is a tendency for increased clock frequencies and at the same time reduced physical size of circuits. Especially circuits for mobile devices not connected to a permanent voltage source are designed to work at low voltage levels and consume only a little amount of energy, which may be achieved for example using power saving techniques. For example, power-gating or clock gating techniques may be applied for reduced power consumption of temporarily unused sub-circuits or modules of the integrated circuit.

At the same time, integrated circuits for example for modern mobile devices often require high frequencies, which may require the integrated circuit to handle higher voltage levels. This may sometimes for example lead to overdrive voltages or other electrical stress conditions for the circuit or parts of it, which may reduce reliability of the integrated circuit output and longevity of the integrated circuit. For example, negative bias temperature instability (NBTI) is a key reliability issue in metal-oxide semiconductor field effect transistors (MOSFET). Most of all, this effect is of immediate concern in p-channel MOS devices, since they very often operate with a negative gate-to-source voltage. NBTI may for example cause gate ageing under overvoltage conditions, an increase in the threshold voltage of a transistor and a decrease in its drain current and transconductance. The degradation may exhibit a logarithmic dependence on time.

SUMMARY OF THE INVENTION

The present invention provides an integrated circuit and a method for reducing an impact of electrical stress in an integrated circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION OF THE PREFERRED EMBODIMENTS

Because the illustrated embodiments of the present invention may for the most part, be implemented using electronic components and circuits known to those skilled in the art, details will not be explained in any greater extent than that considered necessary as illustrated for the understanding and appreciation of the underlying concepts of the present invention and in order not to obfuscate or distract from the teachings of the present invention.

Figure 1:
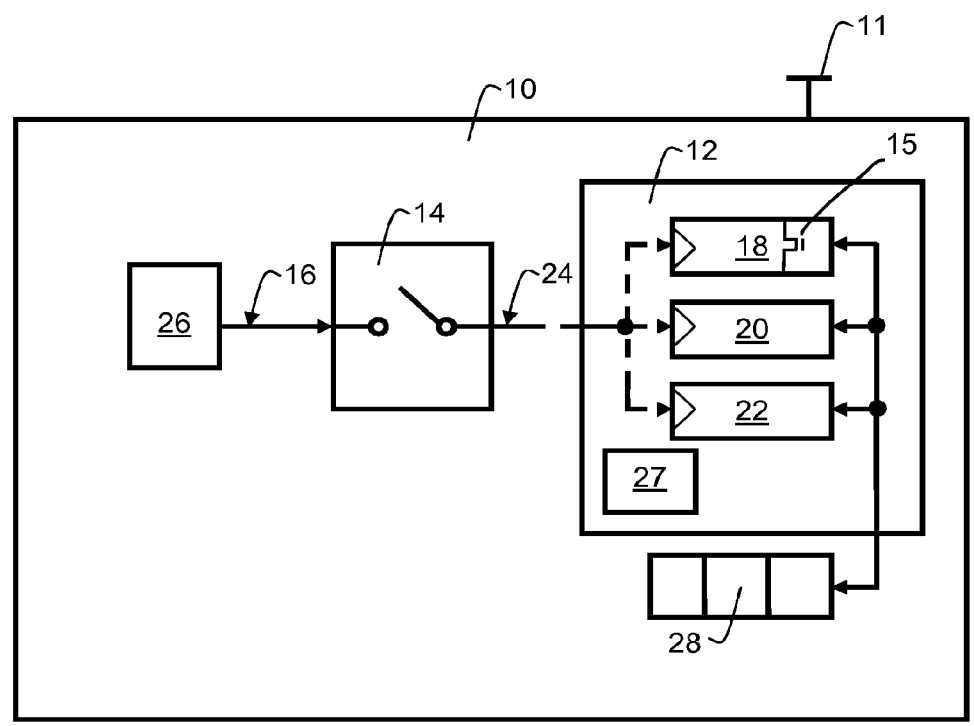
FIG. 1 schematically shows an example of an embodiment of an integrated circuit.

Referring to FIG. 1 an example of an embodiment of an integrated circuit is schematically shown. The shown integrated circuit 10 is an integrated circuit connectable to a power supply 11 and with multiple modules on a common substrate. The modules comprise at least one clock-gated module 12 and a controller unit 14 arranged to enable and disable provision of a clock signal 16 to the at least one clock-gated module 12. The at least one clock-gated module 12 comprises one or more electronic circuits 18, 20, 22 arranged to be, when the at least one clock-gated module 12 is connected to the power supply 11 and the provision is disabled, as indicated with dashed line 24, in a first state of an electrical stress condition during a first portion of a period of time and in a second state of no or less electrical stress than in the first state during a second portion of the period of time. The at least one clock-gated module is arranged to, switch the one or more electronic circuits 18, 20, 22 between the first state and the second state such that a change of a characteristic of at least one of the one or more electronic circuits 18, 20, 22 caused by the electrical stress condition is at least partially reduced.

As shown, the integrated circuit 10 may comprise a clock signal generating circuit 26 arranged to provide the clock signal 16. In the shown example, a single circuit is shown. However, the integrated circuit may comprise a plurality of clock generating circuits 26, or may be coupled to one or more external clock signal sources.

The integrated circuit 10 may comprise one or a plurality of modules, wherein one or more, e.g. all, may be clock-gated modules 12.

A clock-gated module 12 may be a portion of the integrated circuit 10 which operates as a synchronous circuit (when receiving a clock signal), i.e. when the provision of the clock signal 16 is enabled by the controller unit 14, but which may be subject to clock-gating. Clock-gating is a power-saving technique available for synchronous circuits. In order to save power, the clock signal is disabled for entire portions (clock-gated modules 12) of the integrated circuit 10. So that, for example, flip-flop circuits in the respective module 12 do not receive the clock trigger to change state. This may reduce switching power consumption, and only leakage currents may be observed.

As another power saving technique, power-gating of a module of an electronic system may be used. Power-gating may for example be used when the module may be inactive from time to time and may therefore be disconnected temporarily from the power supply, independent of the connection of other parts of the integrated circuit to the power supply. However, the shown integrated circuit 10 with at least one clock-gated module 12 may be left connected, i.e. electrically connected, to the power supply 11. It may not require switching off the connection between the power supply 11 and the module 12 in order to reduce electrical stress and power consumption of the module 12. The module 12 may be left powered on.

Disabling the clock signal 24 for the electronic circuits 18, 20, 22 of a clock-gated module 12 may leave the electronic circuits 18, 20, 22 of the module 12 in a certain state, which may correspond to an electrical stress condition for the particular electronic circuit, especially when applied for a long period of time. An electronic circuit 18, 20, 22 may for example be a transistor device or a diode or a more complex circuit comprising for example multiple transistors or diodes. This electrical stress condition may lead to a change of characteristics of at least a part of the circuit due to, for example, increased circuit ageing.

An electronic circuit may be arranged to be in at least two different states: powered on and off. A transistor, such as a field-effect transistor (FET) 15, may be considered to be in a first or second state when its drain-source-path is in a conductive or non-conductive state, respectively. Switching an electronic circuit may refer to changing the current state of the electronic circuit from the first to the second state or vice versa. Switching a transistor, such as a FET, may refer to changing the current state of the drain-source-path of the FET between the first and the second state depending on a state of its gate, which may be determined by the voltage received at its gate terminal. The shown clock-gated module 12 is arranged to change the state of all or at least one of the electronic circuits 18, 20, 22 of the module 12, for example in the case of field-effect transistors by changing the gate voltage, therefore at least reducing negative impact of a stress condition. For example, all electronic circuits 18, 20, 22 may be switched, thereby ending, or at least reducing, the electrical stress of stressed circuits and applying electrical stress to electronic circuits which may have been free from voltage stress or may have been subject to less electrical stress before. This may allow for distributing electrical stress between electronic circuits 18, 20, 22 of the clock-gated module 12 and may reduce or even compensate for changes in a characteristic of the electronic circuits 18, 20, 22.

The characteristic may for example comprise a threshold voltage, for example of a transistor or a diode circuit, for example determining when the respective circuit switches into a conductive state. The state of, for example, a transistor such as a field-effect transistor (FET) may depend on the state of its gate, i.e. whether a voltage level received at the gate is below or above the threshold voltage, wherein one of the states may be a state of electrical stress for the FET, e.g. due to an overvoltage received at the gate. The first state of electrical stress condition and the second state of less electrical stress may correspond to first and second gate voltage levels above and below a level of the threshold voltage. Changes of a characteristic of one or more electronic circuits of a module may, for example, result in a slower or even wrong behaviour of the particular module. For example, a shift of the threshold voltage of a FET, e.g. a metal-oxide semiconductor FET (MOSFET), which may correspond to a voltage level at the gate of the FET, above which the drain-source-path of the FET is switched from a non-conductive into a conductive state, may slow down (or accelerate) switching of the FET. Gate ageing induced by electrical stress applied to the gate of the FET may for example slow down the FET, e.g. until it stops functioning.

Another example may be the transconductance of the respective circuit. Electrical stress, especially over a longer period of time, may for example cause or increase electromigration, hot carriers injection or may, in a MOSFET even cause time-dependent gate oxide breakdown (or time-dependent dielectric breakdown, TDDB), when the gate oxide breaks down as a result of long-time application of an electric field, resulting in changes in the characteristics.

As another example, the electrical stress condition may be caused by a bias temperature instability effect, for example negative, or sometimes positive, bias temperature instability in metal oxide semiconductor FETs. This effect, which may cause, for example, a threshold shift of the electronic circuit 18, 20, 22, may on the one hand increase over time. On the other hand, the impact of this effect may not only be reduced by ending the voltage stress condition for the electronic circuit but may also, fully or at least partly, be compensated by removing the electrical stress condition from the electronic circuit 18, 20, 22 and switching it into a state of no or reduced electrical stress condition.

In the clock-gated state, i.e. when the provision of the clock signal to the clock-gated module 12 is disabled, the first and second portion of the period may be controlled in any manner suitable the specific implementation. For example, the electronic system 10 may be arranged such that the first portion and the second portion of the period of time are equal, i.e. at least substantially equal, during which an electronic circuit 18, 20, 22 may remain in the first state of electrical stress condition and in the second state of no or less electrical stress than in the first state. For a reversible change of a characteristic this may allow for compensation of the change, completely or at least partly.

Also, the clock-gated module 12 may be arranged to alternatingly switch its electronic circuits 18, 20, 22 for equal portions of time between the first and second state, which may help assure that all electronic circuits 18, 20, 22 receive the voltage stress condition for equal durations of time. For example, a special, e.g. very low frequency, switching pattern may be run on the module comprising transistors while in a long stop mode (with provision of clock signal disabled) to keep a 50% duty cycle for all transistors, and thus reduce, for example, NBTI by not applying constant DC bias voltages. For example, gates of FETs in the module may receive the same voltage stress and the FETs may be subject to, for example, NBTI to a similar or equal extent.

In an embodiment, the at least one clock-gated module 12 may be arranged to switch the one or more electronic circuits 18, 20, 22 between the first state and the second state periodically, as long as the provision of the clock signal is disabled. The switching period may be independent and/or different from the disabled clock signal. The switching period may be relatively short or long, seconds, minutes or probably hours or even longer, depending on the expected impact of electrical stress on a particular clock-gated module and a range of an acceptable additional power consumption for switching between first and second state. For example, in order to reduce NBTI impact for all gates of transistors of electronic circuits 18, 20, 22 to the same minimum possible value in the cases gates are powered on, a suitable switching pattern may be applied.

Switching between the first and second state corresponding to the application of electrical stress and the release from electrical stress may for example be triggered by an additional internal or external dedicated (slow) clock (27).

A clock-gated module 12 may comprise electronic components and circuits of any kind. The module may or may not comprise other additional electric circuitry. An electronic circuit 18, 20, 22 may comprise synchronous, i.e. clocked, circuits. Additionally, it may or may not comprise asynchronous circuits. The one or more electronic circuits 18, 20, 22 may for example comprise at least one field effect transistor (FET) circuit such as a MOSFET, which may either be a p-channel (PMOS), or n-channel (NMOS) transistor or may implement any other transistor technology.

The electronic circuits may comprise any suitable type of circuit, for example transistors or diodes, but also any kind of for example logic circuitry, or for example synchronous circuitry. In an embodiment, the one or more electronic circuits 18, 20, 22 may comprise at least one bistable multivibrator circuit, such as a flip-flop circuit or latch. A bistable multivibrator is a multivibrator circuit which is stable in either state. In another embodiment, the term electronic circuit may for example also refer to monostable or astable multivibrators.

The one or more electronic circuits 18, 20, 22 may for example be arranged to switch into a scan chain mode wherein some or all of the one or more electronic circuits 18, 20, 22 may be serially connected, forming at least one scan chain, and the one or more electronic circuits 18, 20, 22 may be arranged to switch to the first state or to the second state depending on one or more binary patterns loaded into the at least one scan chain.

A signal for switching the electronic circuits 18, 20, 22 into a scan chain mode may for example be provided by an additional scan chain controller unit (not shown) or may be provided by the controller unit 14 or may be directly coupled to provision of the clock signal, i.e. disabling the clock signal may trigger switching the electronic circuits 18, 20, 22 into scan chain mode, wherein electronic circuits such as bistable multivibrators are arranged to serially connect with each other, forming a scan chain. This may allow to use a feature of the electronic circuits without additional implementation effort, if the feature is already available due to design for test (DFT) implementation considerations, where scan chains are used during hardware product design. With this additionally available circuitry the integrated circuit 10 may be referred to, for example, as a logic built-in self-test (LBIST) system. The objective of implementing scan chains is usually to make testing easier by providing a simple way to set and observe for example flip-flops in the module. A special signal called "scan enable" added to a design may be asserted, and for example receiving flip-flop circuits may connect into at least one long shift register, which may allow reading the current state of each flip-flop and writing an arbitrary binary pattern into the chain of electronic circuits. A dedicated clock signal different from or derived from the main clock signal 16, which is not provided to the clock-gated module 12 during clock-gating, may be available for inserting the binary pattern for switching states of electronic circuits 18, 20, 22.

A timing critical path in a module may comprise one or more connected electronic circuits being subject to changes in their switching characteristics, where already a small change of a characteristic of the circuit, such as a small speed deviation, may result in an erroneous behaviour of the module, e.g. because of accumulation of the deviation within the path. In an embodiment, at least one of the one or more electronic circuits 18, 20, 22 may be comprised in a timing critical path of the at least one clock-gated module 12 and at least one of the one or more binary patterns may be adapted or optimized to switch the at least one of the one or more electronic circuits 18, 20, 22 to the second state. In order to determine, which paths through the circuitry of a clock-gated module 12 may be timing critical and may be more sensitive to ageing and changes of characteristic parameters of electronic circuits comprised in the particular path, for example simulations, e.g. previous to realization of the electronic system 10 in hardware, may be carried out.

Alternatively or additionally, the one or more binary patterns may be adapted or optimized to switch a maximum amount of electronic circuits 18, 20, 22 to a different state, such as a different first state of electrical stress condition or the second state of no or less electrical stress condition, depending on the previous state. Again, suitable binary patterns may, for example, be determined by preceding simulation of the electronic system 10. An optimized binary pattern may allow to switch a maximum amount of electronic circuits with a minimum of switching operations, in order to reduce power consumption to a minimum.

In an embodiment of the integrated circuit 10, at least one of the one or more electronic circuits 18, 20, 22 may be arranged to save a state information (e.g. binary one or zero) characterizing a current state of the at least one of the one or more electronic circuits 18, 20, 22 when the provision of the clock signal is disabled and to load the state information when the provision of the clock signal is enabled.

A state retention signal may for example be provided by a state retention controller (not shown) or for example by the controller unit 14. State retention may be used in power gating techniques, the provided clock-gated modules may be implemented without power gating. Also, the clock-gated module 12 itself may be arranged to store state information of comprised electronic circuits 18, 20, 22 when the clock signal is disabled by the controller unit 14, e.g. in a dedicated memory. For example, at least one of the one or more electronic circuits 18, 20, 22, for example a state retention bistable multivibrator, may comprise a state retention cache arranged to store the corresponding state information.

Additionally or alternatively, the integrated circuit 10 may comprise a state retention memory unit 28 outside the module 12. The at least one of the one or more electronic circuits 18, 20, 22, which are arranged to store and load their current state information, may be arranged to connect to the state retention memory unit 28, for saving and loading the state information. For example, in an integrated circuit 10 which provides scan chains, the current state information may be read out when scan chain mode is enabled, but before starting to enter binary patterns for switching the electronic circuits between first and second state. The state information may be restored from the state retention memory unit 28, for example after inserting binary switching patterns into the scan chain set up by electronic circuits 18, 20, 22.

Preceding saving and subsequent loading of state information for the electronic circuits 18, 20, 22 may allow to apply clock gating, and thereby power saving, not only to inactive modules of the electronic system. It may also, for example, allow to freeze modules (preferably of low activity) and postpone processing intended to be carried out by the particular module until a later time. Hence, the total power saving may be increased.

Figure 2:
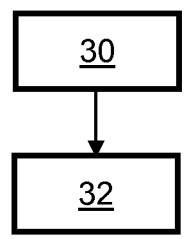
FIG. 2 schematically shows an example of a first embodiment of method for reducing an impact of electrical stress in an integrated circuit.

Referring to FIG. 2, an example of a first embodiment of method for reducing an impact of electrical stress in an integrated circuit is schematically shown. The methods described below and illustrated in FIG. 2 and FIG. 3 allow implementing the advantages and characteristics of the described electronic system as part of a method for reducing an impact of electrical stress in an integrated circuit and may be performed by the integrated circuit 10. A method is shown for reducing an impact of electrical stress in an integrated circuit comprising a plurality of modules in a common substrate, the plurality comprising at least one clock-gated module, wherein the at least one clock-gated module is connected to a power supply and comprises one or more electronic circuits arranged to be, when a provision of a clock signal to the at least one clock-gated module is disabled, in a first state of an electrical stress condition during a first portion of a period of time and in a second state of no or less electrical stress than in the first state during a second portion of the period of time. The method comprises disabling 30 the provision of the clock signal to the at least one clock-gated module; and switching 32 the one or more electronic circuits between the first state and the second state such that a change of a characteristic of at least one of the one or more electronic circuits caused by the electrical stress condition is at least partially compensated. In an embodiment, the disabled clock signal may be enabled again afterwards. In an embodiment, the method or e.g. the step of switching may be repeated periodically.

Figure 3:
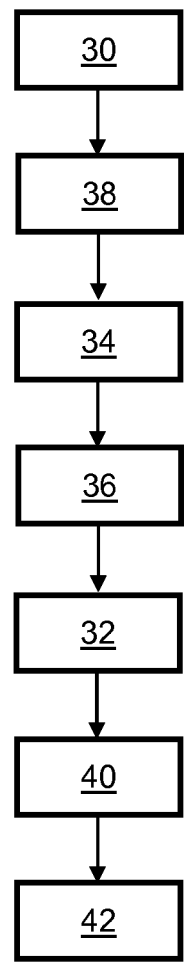
FIG. 3 schematically shows an example of a second embodiment of method for reducing an impact of electrical stress in an integrated circuit.

Referring to FIG. 3, an example of a second embodiment of method for reducing an impact of electrical stress in an integrated circuit is schematically shown, which may additionally comprise switching 34 the at least one clock-gated module into a scan chain mode and loading 36 a binary pattern into the one or more electronic circuits for triggering the switching 32 the one or more electronic circuits between the first state and the second state.

In an embodiment, the method shown in FIG. 3 or FIG. 2 may comprise saving 38 a state information characterizing a current state of the at least one of the one or more electronic circuits when the provision of the clock signal is disabled 30 and loading 40 the state information when the provision of the clock signal is enabled 42.

The invention may also be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, the shown controller unit 14 may be a part of the clock-gated module 12 or the shown state retention memory unit 28 may be a part of the clock-gated module 12 or may be distributed across a plurality of clock-gated modules.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, in one embodiment, the illustrated examples may be implemented as circuitry located on a single integrated circuit or within a same device. For example, the integrated circuit 10 may comprise a plurality of clock-gated modules 12 all integrated in a single device. Alternatively, the example may be implemented as any number of separate integrated circuits or separate devices interconnected with each other in a suitable manner. For example, each clock-gated module 12 of the integrated circuit 10 or some electronic circuits 18, 20, 22 of a clock-gated module 12 may be implemented in a dedicated device.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

While the principles of the invention have been described above in connection with specific apparatus, it is to be clearly understood that this description is made only by way of example and not as a limitation on the scope of the invention.

The invention claimed is:

1. An integrated circuit configured to be connected to a power supply and comprising:
   a plurality of modules on a common substrate, said plurality of modules comprising at least one clock-gated module; and
   a controller unit arranged to enable and disable provision of a clock signal to said at least one clock-gated module, wherein, when said at least one clock-gated module is connected to said power supply and said provision is disabled,
      said at least one clock-gated module comprises one or more electronic circuits arranged to be in a first state of an electrical stress condition during a first portion of a period of time and in a second state of less electrical stress than in the first state during a second portion of said period of time, and
      said at least one clock-gated module is arranged to switch said one or more electronic circuits between said first state and said second state such that a change, of a characteristic of at least one of said one or more electronic circuits, caused by said electrical stress condition is at least partially reduced.

2. The integrated circuit as claimed in claim 1, wherein said one or more electronic circuits comprise at least one field effect transistor circuit.

3. The integrated circuit as claimed in claim 2, wherein said characteristic comprises a threshold voltage.

4. The integrated circuit as claimed in claim 3, wherein said first state of electrical stress condition and said second state of less electrical stress correspond to first and second gate voltage levels above and below a level of said threshold voltage, respectively.

5. The integrated circuit as claimed in claim 1, wherein said electrical stress condition is caused by a bias temperature instability effect.

6. The integrated circuit as claimed in claim 1, wherein said first portion and said second portion are equal.

7. The integrated circuit as claimed in claim 1, wherein said at least one clock-gated module is arranged to switch said one or more electronic circuits between said first state and said second state periodically, as long as said provision of said clock signal is disabled.

8. The integrated circuit as claimed in claim 1, wherein said one or more electronic circuits comprise at least one bistable multivibrator circuit.

9. The integrated circuit as claimed claim 1, wherein said one or more electronic circuits are arranged to switch into a scan chain mode wherein some or all of said one or more electronic circuits are serially connected forming at least one scan chain and said one or more electronic circuits are arranged to switch to said first state or to said second state depending on one or more binary patterns loaded into said at least one scan chain.

10. The integrated circuit as claimed in claim 9, wherein at least one of said one or more electronic circuits is comprised in a timing critical path of said at least one clock-gated module and at least one of said one or more binary patterns is adapted to switch said at least one of said one or more electronic circuits to said second state.

11. The integrated circuit as claimed in claim 9, wherein said one or more binary patterns are adapted to switch a maximum amount of electronic circuits to a different state.

12. The integrated circuit as claimed in claim 1, wherein at least one of said one or more electronic circuits is arranged to:
   save a state information characterizing a current state of said at least one of said one or more electronic circuits when said provision of said clock signal is disabled; and to
   load said state information when said provision of said clock signal is enabled.

13. The integrated circuit as claimed in claim 12, wherein said at least one of said one or more electronic circuits comprises a state retention cache arranged to store said state information.

14. The integrated circuit as claimed in claim 12, wherein said integrated circuit comprises a state retention memory unit and said at least one of said one or more electronic circuits is arranged to connect to said state retention memory unit for saving and loading said state information.

15. A method for reducing an impact of electrical stress in an integrated circuit comprising a plurality of modules on a common substrate, said plurality comprising at least one clock-gated module, wherein said at least one clock-gated module is connected to a power supply and comprises one or more electronic circuits arranged to be, when a provision of a clock signal to said at least one clock-gated module is disabled, in a first state of an electrical stress condition during a first portion of a period of time and in a second state of less electrical stress than in the first state during a second portion of said period of time; said method comprising disabling said provision of said clock signal to said at least one clock-gated module; and switching said one or more electronic circuits between said first state and said second state such that a change, of a characteristic of at least one of said one or more electronic circuits, caused by said electrical stress condition is at least partially compensated.

16. The method as claimed in claim 15, comprising switching said at least one clock-gated module into a scan chain mode and loading a binary pattern into said one or more electronic circuits for triggering said switching said one or more electronic circuits between said first state and said second state.

17. The method as claimed in claim 15, comprising saving a state information characterizing a current state of said at least one of said one or more electronic circuits when said provision of said clock signal is disabled and loading said state information when said provision of said clock signal is enabled.

18. A non-transitory computer program product comprising code portions for executing steps of a method when run on a programmable apparatus, the method including:

disabling a provision of a clock signal to a clock-gated module of an integrated circuit comprising a plurality of modules on a common substrate, the plurality of modules including the clock-gated module, wherein the clock-gated module is connected to a power supply and includes an electronic circuit to be, when a provision of a clock signal to said at least one clock-gated module is disabled, in a first state of an electrical stress condition during a first portion of a period of time and in a second state of less electrical stress than in the first state during a second portion of said period of time; and switching the electronic circuit between the first state and the second state to at least partially compensated a change of a characteristic of the electronic circuit caused by the electrical stress condition.

19. The non-transitory computer program product of claim 18, wherein the method further includes:

saving a state information characterizing a current state of the electronic circuit when the provision of the clock signal is disabled; and loading the state information when the provision of the clock signal is enabled.

20. The non-transitory computer program product of claim 18, wherein the method further includes:

switching the clock-gated module into a scan chain mode and loading a binary pattern into the electronic circuit for triggering the switching of the electronic circuit between the first state and the second state.

\* \* \* \* \*